United States Patent
Chen et al.

(10) Patent No.: US 12,351,116 B2
(45) Date of Patent: Jul. 8, 2025

(54) ISOLATION CIRCUIT, AUTOMOBILE DIAGNOSIS DEVICE, AND AUTOMOBILE DIAGNOSIS SYSTEM

(71) Applicant: AUTEL INTELLIGENT TECHNOLOGY CORP., LTD., Guangdong (CN)

(72) Inventors: Huaming Chen, Guangdong (CN); Haibo Pang, Guangdong (CN); Honghua Lu, Guangdong (CN)

(73) Assignee: AUTEL INTELLIGENT TECHNOLOGY CORP., LTD., Guangdong (CN)

( * ) Notice: Subject to any disclaimer, the term of this patent is extended or adjusted under 35 U.S.C. 154(b) by 427 days.

(21) Appl. No.: 17/807,987

(22) Filed: Jun. 21, 2022

(65) Prior Publication Data

US 2022/0314908 A1  Oct. 6, 2022

Related U.S. Application Data

(63) Continuation of application No. PCT/CN2020/133795, filed on Dec. 4, 2020.

(30) Foreign Application Priority Data

Jan. 3, 2020  (CN) .......................... 202010006699.8

(51) Int. Cl.
*B60R 16/02* (2006.01)
*B60R 16/023* (2006.01)
*G01R 31/00* (2006.01)

(52) U.S. Cl.
CPC ........ *B60R 16/0232* (2013.01); *G01R 31/007* (2013.01)

(58) Field of Classification Search
CPC ... B60R 16/0232; G01R 31/007; B60W 10/00
See application file for complete search history.

(56) References Cited

U.S. PATENT DOCUMENTS

| 5,530,298 | A  | * | 6/1996 | Gerhold | ............... | H03K 17/691 |
|---|---|---|---|---|---|---|
| | | | | | | 307/106 |
| 7,515,725 | B2 | * | 4/2009 | Fluit | ..................... | H04R 25/30 |
| | | | | | | 330/297 |

(Continued)

FOREIGN PATENT DOCUMENTS

| CN | 102591326 A | 7/2012 |
|---|---|---|
| CN | 103022966 A | 4/2013 |

(Continued)

OTHER PUBLICATIONS

The International Search Report mailed Mar. 3, 2021; PCT/CN2020/133795.

*Primary Examiner* — Daniel Kessie
*Assistant Examiner* — Brian K Baxter

(57) ABSTRACT

The present invention relates to the field of automobile diagnosis, and provides an isolation circuit, an automobile diagnosis device and an automobile diagnosis system. The isolation circuit comprises: a first switch circuit electrically connected between an OBD connector of an automobile to be diagnosed and a diagnostic device of the automobile diagnosis device, wherein the OBD connector is further electrically connected to an automobile power supply of the automobile to be diagnosed; and a switch control circuit electrically connected to the OBD connector and the first switch circuit respectively, wherein the switch control circuit does not operate when it is detected that the OBD connector outputs a power supply positive electrode signal and it is not detected that the OBD connector outputs a power supply negative electrode signal, so that the first switch circuit operates in an off state to ensure that the (Continued)

diagnostic device is not powered on; and the switch control circuit outputs a control signal when it is detected that the OBD connector outputs a power supply positive electrode signal and that the OBD connector outputs a power supply negative electrode signal, so that the first switch circuit operates in an on state so as to enable the automobile power supply to supply power to the diagnostic device. Embodiments of the present invention can avoid poor grounding and improve the reliability of automobile diagnosis device.

14 Claims, 3 Drawing Sheets

(56) References Cited

U.S. PATENT DOCUMENTS

| | | | | |
|---|---|---|---|---|
| 9,157,942 | B2* | 10/2015 | Rutheiser | G01R 31/008 |
| 10,515,780 | B1* | 12/2019 | Nouri | H01J 37/248 |
| 11,002,779 | B2* | 5/2021 | Haro | G01R 31/007 |
| 11,211,929 | B2* | 12/2021 | Rinne | H02M 1/08 |
| 2004/0042239 | A1* | 3/2004 | Kitano | H02M 3/33523 |
| | | | | 363/49 |
| 2004/0054503 | A1* | 3/2004 | Namaky | G01R 31/007 |
| | | | | 702/183 |
| 2009/0289846 | A1* | 11/2009 | Ammann | G01S 19/29 |
| | | | | 342/357.29 |
| 2014/0265592 | A1* | 9/2014 | Clarke | H02J 9/061 |
| | | | | 307/66 |
| 2016/0121851 | A1* | 5/2016 | Chambers | B60R 25/30 |
| | | | | 701/34.4 |
| 2017/0026196 | A1 | 1/2017 | Miners et al. | |
| 2019/0118668 | A1* | 4/2019 | Dan | B60L 50/66 |
| 2019/0356160 | A1* | 11/2019 | Zhao | H02J 9/06 |
| 2022/0094354 | A1* | 3/2022 | Chen | G01R 19/0084 |
| 2023/0335091 | A1* | 10/2023 | Morsy | G06F 1/165 |
| 2024/0364205 | A1* | 10/2024 | Ye | H02M 3/156 |

FOREIGN PATENT DOCUMENTS

| | | |
|---|---|---|
| CN | 205186049 U | 4/2016 |
| CN | 206422329 U | 8/2017 |
| CN | 111064464 A | 4/2020 |
| CN | 211457114 U | 9/2020 |

* cited by examiner

ISOLATION CIRCUIT, AUTOMOBILE DIAGNOSIS DEVICE, AND AUTOMOBILE DIAGNOSIS SYSTEM

This application is a continuation of International Patent Application No. PCT/CN2020/133795 filed on Dec. 4, 2020, which claims priority to Chinese Patent Application No. 202010006699.8, entitled "Isolation circuit, automobile diagnosis device, and automobile diagnosis system", filed to China Patent Office on Jan. 3, 2020, the entire contents of both of which are incorporated herein by reference.

TECHNICAL FIELD

The present application relates to the field of automobile diagnosis, and more particularly to an isolation circuit, an automobile diagnosis device, and an automobile diagnosis system.

BACKGROUND ART

At present, the automobile diagnosis device is used to connect with the OBD connector of the automobile to be diagnosed, read the fault code of the automobile to be diagnosed, and locate the location and cause of the fault. However, if a non-standard OBD connector is used for the automobile to be diagnosed, although the automobile to be diagnosed has no fault, it may lead to poor grounding when the automobile diagnosis device is connected to the OBD connector since there is deviation between the design dimension of the non-standard OBD connector and the design dimension of the standard OBD connector. That is, the positive electrode of the automobile power supply is connected to the automobile diagnosis device prior to the negative electrode of the automobile power supply, so that the instrument panel of the automobile to be diagnosed illuminates the fault lamp, which may easily interfere with the judgment of the automobile maintenance personnel.

SUMMARY OF THE INVENTION

Embodiments of the present invention aim to provide an isolation circuit, an automobile diagnosis device, and an automobile diagnosis system that can avoid poor grounding and improve the reliability of the automobile diagnosis device.

In order to solve the above technical problem, embodiments of the present invention provide the following technical solutions.

In a first aspect, an embodiment of the invention provides an isolation circuit applied to an automobile diagnosis device, wherein the isolation circuit includes:
a first switch circuit electrically connected between an OBD connector of an automobile to be diagnosed and a diagnostic device of the automobile diagnosis device, wherein the OBD connector is also electrically connected to an automobile power supply of the automobile to be diagnosed;
a switch control circuit electrically connected to the OBD connector and the first switch circuit respectively, wherein the switch control circuit does not operate when it is detected that the OBD connector outputs a power supply positive electrode signal and it is not detected that the OBD connector outputs a power supply negative electrode signal, so that the first switch circuit operates in an off state to ensure that the diagnostic device is not powered on; and the switch control circuit outputs a control signal when it is detected that the OBD connector outputs a power supply positive electrode signal and that the OBD connector outputs a power supply negative electrode signal, so that the first switch circuit operates in an on state so as to enable the automobile power supply to supply power to the diagnostic device.

Optionally, the automobile power supply comprises a positive electrode of the automobile power supply for outputting the power supply positive electrode signal and a negative electrode of the automobile power supply for outputting the power supply negative electrode signal, wherein the switch control circuit includes:
a bias circuit electrically connected to the positive electrode of the automobile power supply for converting a power supply voltage output by the positive electrode of the automobile power supply into a bias voltage;
a second switch circuit electrically connected to the positive electrode of the automobile power supply;
a buck chopper circuit electrically connected to the second switch circuit, the negative electrode of the automobile power supply and the first switch circuit, respectively;
a controller electrically connected to the positive electrode of the automobile power supply, the negative electrode of the automobile power supply, the bias circuit, the second switch circuit and the buck chopper circuit respectively, wherein the controller does not operate when it is detected that the OBD connector outputs a power supply positive electrode signal and it is not detected that the OBD connector outputs a power supply negative electrode signal; the controller detects a current detection signal flowing through the second switch circuit when it is detected that the OBD connector outputs the power supply positive electrode signal and it is detected that the OBD connector outputs the power supply negative electrode signal, and outputs a pulse width modulated signal according to the bias voltage and the current detection signal to control the operating state of the second switch circuit, so that the buck chopper circuit outputs the control signal.

Optionally, the bias circuit comprises a first resistor and a first capacitor;
one end of the first resistor is connected to the positive electrode of the automobile power supply, one end of the first capacitor, and the second switch circuit; and the other end of the first resistor is connected to the other end of the first capacitor, and the controller.

Optionally, the second switch circuit comprises a PMOS tube, wherein a gate electrode of the PMOS tube is connected to the controller; a source electrode of the PMOS tube is connected to the positive electrode of the automobile power supply; and a drain electrode of the PMOS tube is connected to the controller and the buck chopper circuit.

Optionally, the buck chopper circuit comprises:
a freewheeling circuit electrically connected to the second switch circuit and the negative electrode of the automobile power supply, wherein freewheeling circuit operates in an off state when the second switch circuit operates in an on state, and operates in an on state when the second switch circuit operates in an off state;
a charge-discharge circuit electrically connected to the second switch circuit, the freewheeling circuit, the negative electrode of the automobile power supply, and the first switch circuit, respectively, wherein the charge-discharge circuit performs charging as the freewheeling circuit operates in the off state when it is detected that the OBD connector outputs a power supply positive electrode signal and that the OBD connector outputs a power supply negative electrode signal; and the charge-discharge circuit performs discharging when the freewheeling circuit operates in an on state to output the control signal and send the control signal to the first switch circuit.

Optionally, the freewheeling circuit comprises a diode, wherein the anode of the diode is connected to the negative electrode of the automobile power supply, and the cathode of the diode is connected to the drain electrode of the PMOS tube and the charge-discharge circuit.

Optionally, the charge-discharge circuit comprises an inductor and a second capacitor;
one end of the inductor is connected to the cathode of the diode and the drain electrode of the PMOS tube, and the other end of the inductor is connected to one end of the second capacitor and the first switch circuit; and the other end of the second capacitor is connected to the negative electrode of the automobile power supply.

Optionally, the switch control circuit further comprises a voltage sampling circuit electrically connected to the negative electrode of the automobile power supply, the buck chopper circuit, the first switch circuit, and the controller, respectively, for sampling the control signal to cause the controller to feed back and adjust the control signal.

Optionally, the voltage sampling circuit comprises a second resistor and a third resistor; one end of the second resistor is connected to the buck chopper circuit and the first switch circuit, and the other end of the second resistor is connected to one end of the third resistor and the controller; and the other end of the third resistor is connected to the negative electrode of the automobile power supply.

Optionally, the switch control circuit further comprises an input filter circuit electrically connected between the positive electrode of the automobile power supply and the negative electrode of the automobile power supply for filtering the power supply voltage.

Optionally, the input filter circuit comprises a third capacitor, one end of the third capacitor is connected to the positive electrode of the automobile power supply and the other end of the third capacitor is connected to the negative electrode of the automobile power supply.

Optionally, the isolation circuit further comprises a slow start circuit which is electrically connected to the first switch circuit and the diagnostic device, respectively, for delay processing the power supply voltage output by the automobile power supply when the operating state of the first switch circuit is switched to the on state.

Optionally, the first switch circuit comprises:
a first switch electrically connected between the positive electrode of the automobile power supply and the diagnostic device and also electrically connected to the switch control circuit, for operating in an on state according to the control signal;
a second switch electrically connected between the negative electrode of the automobile power supply and the diagnostic device and also electrically connected to the switch control circuit for operating in an on state according to the control signal.

In a second aspect, an embodiment of the invention provides an automobile diagnosis device comprising:
the isolation circuit as described in any one of the above;
a diagnostic device electrically connected to the isolation circuit and also communicatively connected to the automobile to be diagnosed for performing operation according to the power supply voltage provided by the automobile power supply of the automobile to be diagnosed when the isolation circuit operates in an on state, and acquiring diagnostic data of the automobile to be diagnosed.

In a third aspect, an embodiment of the present invention provides an automobile diagnosis system comprising:
the automobile diagnosis device as described above;
an upper computer communicatively connected to the automobile diagnosis device for displaying diagnostic data sent by the automobile diagnosis device.

Advantageous effects of the present invention are as follows. Compared with the prior art, the embodiments of the present invention provide a first switch circuit electrically connected between an OBD connector of an automobile to be diagnosed and a diagnostic device of the automobile diagnosis device, wherein the OBD connector is further electrically connected to an automobile power supply of the automobile to be diagnosed; and a switch control circuit electrically connected to the OBD connector and the first switch circuit respectively, wherein the switch control circuit does not operate when it is detected that the OBD connector outputs a power supply positive electrode signal and it is not detected that the OBD connector outputs a power supply negative electrode signal, so that the first switch circuit operates in an off state to ensure that the diagnostic device is not powered on; and the switch control circuit outputs a control signal when it is detected that the OBD connector outputs a power supply positive electrode signal and that the OBD connector outputs a power supply negative electrode signal, so that the first switch circuit operates in an on state so as to enable the automobile power supply to supply power to the diagnostic device. Therefore, the embodiment of the present invention can avoid poor grounding and improve the reliability of automobile diagnosis device.

BRIEF DESCRIPTION OF THE DRAWINGS

One or more embodiments are exemplified by the pictures in the accompanying drawings corresponding to them. These illustrative description does not constitute a limitation for embodiments. Those elements with the same reference numerals in the accompanying drawings are represented as similar elements, and the figurers in the accompanying drawings do not constitute a proportion limitation unless otherwise stated.

DETAILED DESCRIPTION OF THE INVENTION

In order to facilitate an understanding of the present application, a more particular description of the application will be rendered by reference to the appended drawings and detailed description. It will be understood that when an element is referred to as being "connected" to another element, it can be directly connected to the other element, or intervening elements may be present. Furthermore, the terms "first", "second", and the like are used for descriptive purposes only and are not to be construed as indicating or implying relative importance.

Unless defined otherwise, all technical and scientific terms used in the specification have the same meaning as commonly understood by one of ordinary skill in the art to which this invention belongs. The terms used in the specification of the invention herein is for the purpose of describing particular embodiments only and is not intended to be limiting of the invention. As used herein, the term "and/or" includes any and all combinations of one or more of the associated listed items.

Furthermore, the technical features involved in the different embodiments of the present application described below can be combined with each other as long as they do not conflict with each other.

Figure 1:
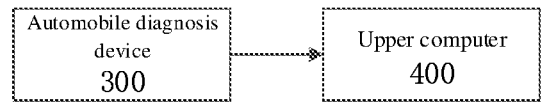
FIG. 1 is a structurally schematic diagram of an automobile diagnosis system according to an embodiment of the present invention.

Referring to FIG. 1, it is a structurally schematic diagram of an automobile diagnosis system according to an embodiment of the present invention. As shown in FIG. 1, the automobile diagnosis system 500 includes an automobile diagnosis device 300 and an upper computer 400 according to an embodiment of the device described below. The upper computer 400 is communicatively connected to the automobile diagnosis device 300 for displaying diagnostic data transmitted from the automobile diagnosis device 300.

An embodiment of the present invention provides an automobile diagnosis system that avoids a poor grounding phenomenon by an automobile diagnosis device, thereby improving the diagnosis reliability.

Figure 2:
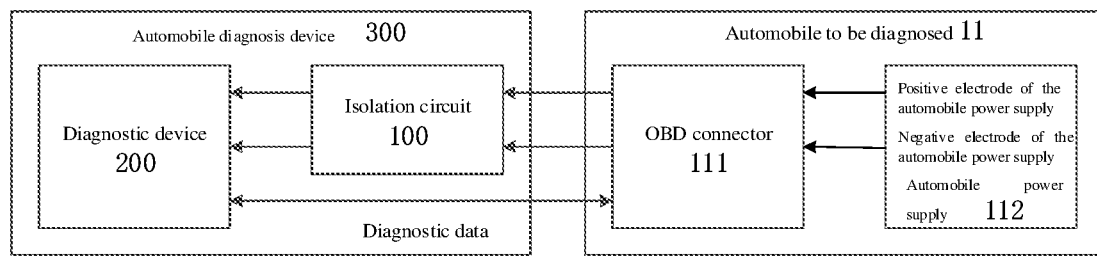
FIG. 2 is a structurally schematic diagram of an automobile diagnosis device according to an embodiment of the present invention.

Referring to FIG. 2, it is a structurally schematic diagram of an automobile diagnosis device according to an embodiment of the present invention. As shown in FIG. 2, the automobile diagnosis device 300 includes an isolation circuit 100 and a diagnostic device 200 as described in the following circuit embodiment. The diagnostic device 200 is electrically connected to the isolation circuit 100 and is also communicatively connected to the automobile 11 to be diagnosed for performing operation according to a power supply voltage provided by an automobile power supply 112 of the automobile 11 to be diagnosed when the isolation circuit 100 operates in an on state, and acquiring diagnostic data of the automobile 11 to be diagnosed.

Herein the automobile 11 to be diagnosed includes an OBD connector 111, an automobile power supply 112 and an on-board automatic diagnosis system (not shown). The automobile power supply 112 includes a positive electrode of the automobile power supply for outputting a power supply positive electrode signal and a negative electrode of the automobile power supply for outputting a power supply negative electrode signal.

Inside the automobile 11 to be diagnosed, the OBD connector 111 is electrically connected to the positive electrode of the automobile power supply and the negative electrode of the automobile power supply, respectively. The automobile diagnosis device 300 is electrically connected with the automobile 11 to be diagnosed. The OBD connector 111 is electrically connected with the isolation circuit 100 and communicatively connected with the diagnostic device 200. If the OBD connector 111 is normally connected to the isolation circuit 100, the isolation circuit 100 is used for enabling the automobile power supply 112 to supply power to the diagnostic device 200 via the isolation circuit 100. After the diagnostic device 200 is powered on, diagnostic data of the automobile 11 to be diagnosed is acquired via the OBD connector 111. If the OBD connector 111 and the isolation circuit 100 are poorly grounded, the isolation circuit 100 is used to cut off the power supply circuit between the automobile power supply 112 and the diagnostic device 200 to keep the diagnostic device 200 unpowered.

The automobile power supply 112 is used for providing a low-voltage direct current power supply for all electric devices in the automobile 11 to be diagnosed (usually 12V for a gasoline vehicle and 24V for a diesel vehicle), so that various parts of the automobile 11 to be diagnosed can work normally. When the automobile diagnosis device 300 is connected to the automobile 11 to be diagnosed, the automobile power supply 112 is also used for providing a power supply for the automobile diagnosis device 300.

The on-board automatic diagnosis system is also electrically connected to the OBD connector 111 (not shown) for monitoring the vehicle 11 to be diagnosed, generating diagnostic data, and transmitting the diagnostic data to the diagnostic device 200 by the OBD connector 111 when the diagnostic device 200 is powered on.

Specifically, the positive power supply electrode signal and the power supply negative electrode signal reach the isolation circuit 100 via the OBD connector 111. The isolation circuit 100 is used for detecting the positive power supply electrode signal and the power supply negative electrode signal. When it is detected that the OBD connector 111 outputs the positive power supply electrode signal and it is not detected that the OBD connector 111 outputs the power supply negative electrode signal, the diagnostic device 200 is not powered on. When it is detected that the OBD connector 111 outputs the power supply positive electrode signal and it is detected that the OBD connector 111 outputs the power supply negative electrode signal, the automobile power supply 112 supplies power to the diagnostic device 200.

An embodiment of the present invention provides an automobile diagnosis device which can prevent the automobile diagnosis device from being poorly grounded by an isolation circuit, thereby improving the reliability of the automobile diagnosis device.

Figure 3:
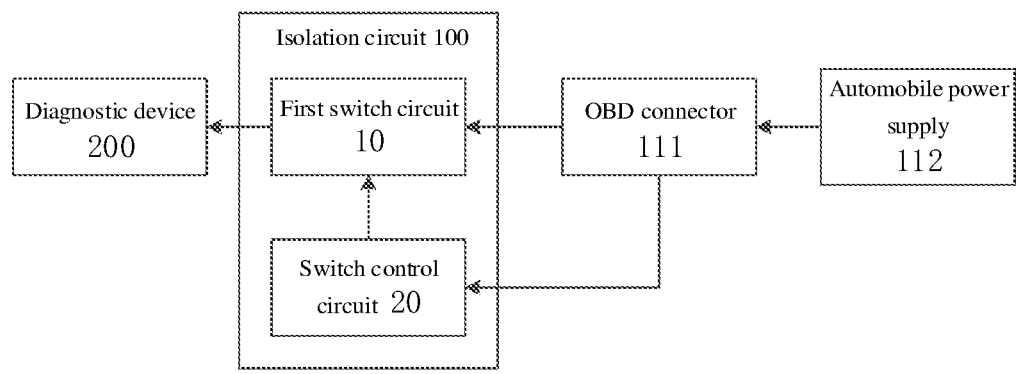
FIG. 3 is a structurally schematic diagram of an isolation circuit according to an embodiment of the present invention.

Referring to FIG. 3, it is a structurally schematic diagram of an isolation circuit according to an embodiment of the present invention. As shown in FIG. 3, the isolation circuit 100 is applied to an automobile diagnosis device 300, and includes a first switch circuit 10 and a switch control circuit 20.

The first switch circuit 10 is electrically connected between an OBD connector 111 of an automobile 11 to be diagnosed and a diagnostic device 200 of the automobile diagnosis device 300, and the OBD connector 111 is also electrically connected to an automobile power supply 112 of the automobile 11 to be diagnosed.

Figure 4:
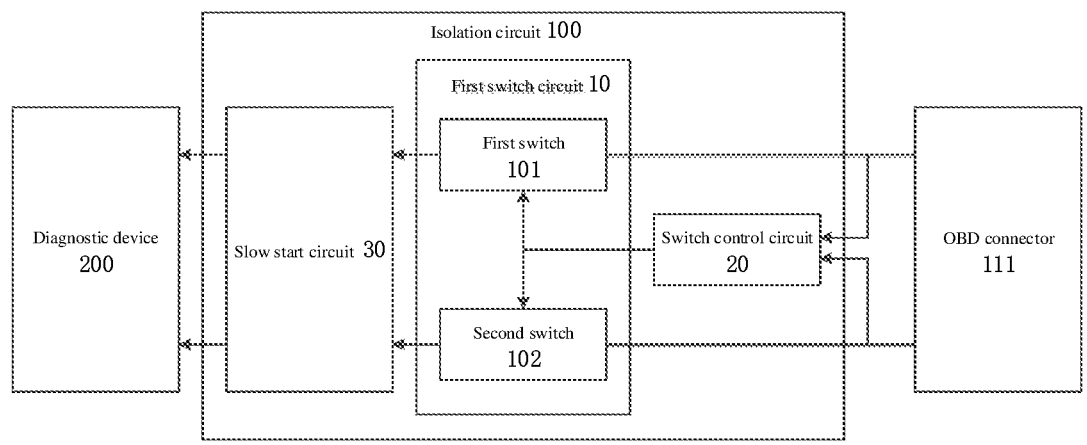
FIG. 4 is a structurally schematic diagram of an isolation circuit according to another embodiment of the present invention.
Figure 5:
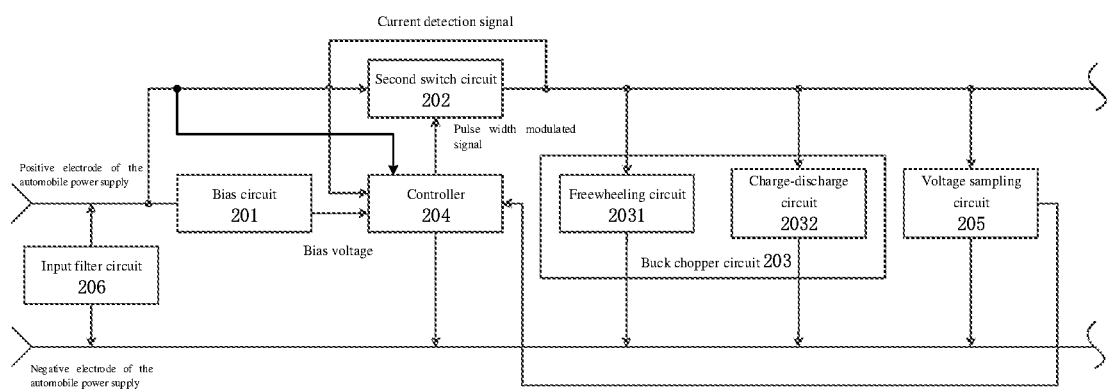
FIG. 5 is a structurally schematic diagram of a switch control circuit according to an embodiment of the present invention.

Referring to FIGS. 4 and 5, the first switch circuit 10 includes a first switch 101 and a second switch 102.

The first switch 101 is electrically connected between the positive electrode of the automobile power supply and the diagnostic device 200 and is also electrically connected to the switch control circuit 20 for operating in an on state according to the control signal.

The second switch 102 is electrically connected between the negative electrode of the automobile power supply and the diagnostic device 200 and is also electrically connected to the switch control circuit 20 for operating in an on state according to the control signal.

In the present embodiment, the first switch 101 and the second switch 102 are normally closed switches. It operates in an on state according to the control signal, and returns to a normally off state when the controller 204 is not operating.

It can be understood that when the first switch 101 and the second switch 102 are both operated in an on state, the first switch 101 and the second switch 102 are electrically connected to the positive electrode of the automobile power supply and the negative electrode of the automobile power supply, respectively, by the OBD connector 111 of the automobile 11 to be diagnosed, so that the power supply voltage provided by the automobile power supply 112 of the automobile 11 to be diagnosed reaches the first switch 101, the second switch 102 and the switch control circuit 20 by the OBD connector 111 to supply power to the first switch 101, the second switch 102 and the switch control circuit 20.

In some embodiments, the first switch 101 and the second switch 102 include a metal-oxide semiconductor field effect transistor, a bipolar transistor, a relay, a switch circuit composed of other transistors, etc. At this moment, when the controller 204 does not operate, the controller 204 sets low an output pin corresponding to the first switch 101 and the second switch 102, and the switch control circuit 20 does not output a control signal, so that the first switch 101 and the second switch 102 operate in an off state. When the controller 204 operates, the output pins of the controller 204 corresponding to the first switch 101 and the second switch 102 output pulse width modulated signals, and the switch control circuit 20 outputs control signals to operate the first switch 101 and the second switch 102 in an on state.

The switch control circuit 20 is electrically connected to the OBD connector 111 and the first switch circuit 10 respectively, wherein the switch control circuit 20 does not operate when it is detected that the OBD connector 111 outputs a power supply positive electrode signal and it is not detected that the OBD connector 111 outputs a power supply negative electrode signal, so that the first switch circuit 10 operates in an off state to ensure that the diagnostic device 200 is not powered on; and the switch control circuit 20 outputs a control signal when it is detected that the OBD connector 111 outputs a power supply positive electrode signal and that the OBD connector 111 outputs a power supply negative electrode signal, so that the first switch circuit 10 operates in an on state so as to enable the automobile power supply 112 to supply power to the diagnostic device 200.

Herein the switch control circuit 20 detecting that the OBD connector 111 outputs a power supply positive electrode signal, and not detecting that the OBD connector 111 outputs a power supply negative electrode signal includes the following situations: the positive electrode of the automobile power supply is connected to the isolation circuit 100 prior to the negative electrode of the automobile power supply. The switch control circuit 20 detecting that the OBD connector outputs a power supply positive electrode signal, and detecting that the OBD connector outputs a power supply negative electrode signal include the following two cases: first, the positive electrode of the automobile power supply and the negative electrode of the automobile power supply are simultaneously connected to the isolation circuit 100; second, the positive electrode of the automobile power supply is connected to the isolation circuit 100 after the negative electrode of the automobile power supply.

It can be seen that when the switch control circuit 20 detects that the OBD connector 111 outputs a power supply positive electrode signal, and does not detect that the OBD connector 111 outputs a power supply negative electrode signal, the positive electrode of the automobile power supply provides an input voltage to the switch control circuit 20 at this moment. Since the switch control circuit 20 is not grounded, the switch control circuit 20 does not operate, so that the first switch circuit 10 operates in an off state, so as to cut off the power supply loop of the automobile power supply 112 and the diagnostic device 200 and keep the diagnostic device 200 from being powered off. Next, manually adjusting the connection between the automobile diagnosis system 300 and the OBD connector 111 includes, for example, re-plugging the automobile diagnosis device 300, so that when the switch control circuit 20 detects that the OBD connector outputs a power supply positive electrode signal, and detects that the OBD connector outputs a power supply negative electrode signal, the positive electrode of the automobile power supply provides an input voltage to the switch control circuit 20 at this time; and the switch control circuit 20 is grounded, and the switch control circuit 20 outputs a control signal, so that the first switch circuit 10 operates in an on state based on the control signal, and the automotive power source 112 supplies power to the diagnostic device 200 by the isolation circuit 100. Thus, it is avoided that the automobile to be diagnosed 11 detects an external high-voltage pulse and triggers an alarm problem due to poor grounding causing the voltage to float high or spark discharge.

Referring again to FIG. 5, the switch control circuit 20 includes a bias circuit 201, a second switch circuit 202, a buck chopper circuit 203, a controller 204, a voltage sampling circuit 205, and an input filter circuit 206.

The bias circuit 201 is electrically connected to the positive electrode of the automobile power supply for converting a power supply voltage output by the positive electrode of the automobile power supply into a bias voltage.

Figure 6:
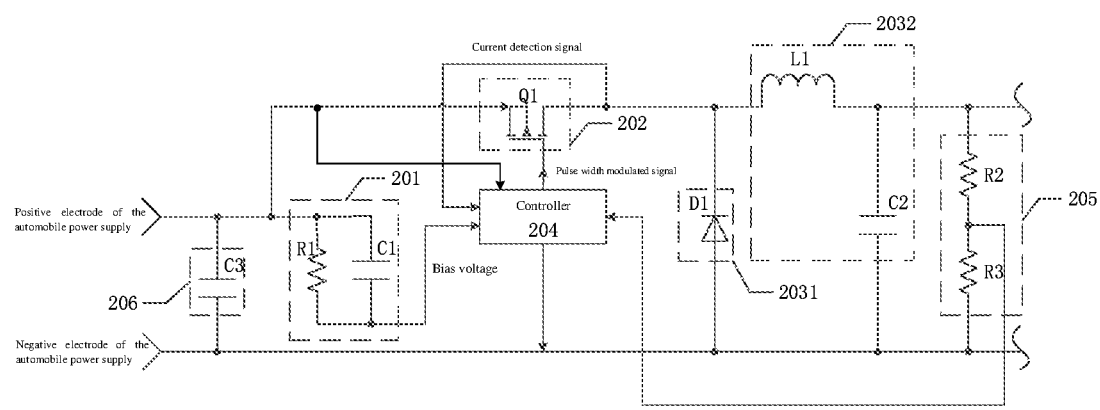
FIG. 6 is a circuit connection diagram of a switch control circuit according to an embodiment of the present invention.

Referring to FIG. 6 together, the bias circuit 201 includes a first resistor R1 and a first capacitor C1. Herein, one end of the first resistor R1 is connected to the positive electrode of the automobile power supply, one end of the first capacitor C1, and the second switch circuit 202; and the other end of the first resistor R1 is connected to the other end of the first capacitor C1, and the controller 204.

The controller 204 includes a constant current source for providing a constant current i, which forms a voltage drop, i. e., a bias voltage V, across the first resistor R1, where the bias voltage $V=R1*i$, and it sends the bias voltage V to the controller 204. In addition, the power supply voltage is slowly activated by the volume effect of the first resistor R1 and the first capacitor C1 to avoid the influence of a spike voltage on the controller 204 and to protect the controller 204 from being burned.

The second switch circuit 202 is electrically connected to the positive electrode of the automobile power supply.

Herein, the second switch circuit 202 includes a PMOS tube Q1. A gate electrode of the PMOS tube Q1 is connected to the controller 204. A source electrode of the PMOS tube Q1 is connected to a positive electrode of the automobile power supply. A drain electrode of the PMOS tube Q1 is connected to the controller 204 and the buck chopper circuit 203.

In some embodiments, the second switch circuit 202 further includes components such as a resistor and/or a capacitor for limiting the gate-source voltage of the PMOS tube Q1 so as to prevent the PMOS tube Q1 from being broken down due to the gate-source voltage being too high.

The buck chopper circuit 203 is electrically connected to the second switch circuit 202, the negative electrode of the automobile power supply and the first switch circuit 10, respectively.

In this embodiment, the buck chopper circuit 203 includes a freewheeling circuit 2031 and a charge-discharge circuit 2032.

The freewheeling circuit 2031 is electrically connected to the second switch circuit 202 and the negative electrode of the automobile power supply. The freewheeling circuit 2031 operates in an off state when the second switch circuit 202 operates in an on state, and operates in an on state when the second switch circuit 202 operates in an off state;

As shown in FIG. 6, the freewheeling circuit 2031 includes a diode D1, an anode of the diode D1 is connected to the negative electrode of the automobile power supply, and a cathode of the diode D1 is connected to a drain electrode of the PMOS tube Q1 and the charge-discharge circuit 2032.

The charge-discharge circuit 2032 is electrically connected to the second switch circuit 202, the freewheeling circuit 2031, the negative electrode of the automobile power supply and the first switch circuit 10, respectively, wherein the charge-discharge circuit 2032 performs charging as the freewheeling circuit 2031 operates in the off state when it is detected that the OBD connector 111 outputs a power supply positive electrode signal and that the OBD connector 111 outputs a power supply negative electrode signal; and the charge-discharge circuit 2032 performs discharging when the freewheeling circuit 2031 operates in an on state to output the control signal and send the control signal to the first switch circuit 10.

As shown in FIG. 6, the charge-discharge circuit 2032 includes an inductor L1 and a second capacitor C2.

Herein, one end of the inductor L1 is connected to the cathode of the diode D1 and the drain electrode of the PMOS tube Q1, and the other end of the inductor L1 is connected to one end of the second capacitor C2 and the first switch circuit 10; and the other end of the second capacitor C2 is connected to the negative electrode of the automobile power supply.

In particular, the pulse width modulated signal is used to modulate the duty cycle of the PMOS tube Q1. When the PMOS tube Q1 is in a turn-on period, the diode D1 is reversely biased, and the power supply voltage charges the first switch circuit 10 via the inductor L1; at this moment, the current iL flowing through the inductor L1 increases, and the energy storage of the inductor L1 increases; and assuming that the power supply voltage is E and the voltage over both ends of the first switch circuit 10 is u0, a forward voltage U1=E−u0 is present over the both ends of the inductor L1, and U1 enables the current iL to linearly increase. When the PMOS tube Q1 is in a turn-off period, the inductor L1 generates an induced electromotive force, the diode D1 is turned on, and the current iL freewheels through the diode D1; and at this time, U1=−u0, the inductor L1 supplies power to the first switch circuit 10, inductor energy storage gradually consumes, and the current iL linearly decreases.

It will be appreciated that the inductance of the inductor L1 and the capacitance of the second capacitor C2 need to be set slightly larger. In the present embodiment, when it is detected that the OBD connector 111 outputs a power supply positive electrode signal and that the OBD connector 111 outputs a power supply negative electrode signal, the controller 204 outputs the pulse width modulated signal for modulating the PMOS tube Q1, so that the charge-discharge circuit 2032 outputs the control signal according to the duty ratio of the PMOS tube Q1. Herein, the control signal is a sine wave signal. By setting the duty ratio of the pulse width modulated signal, the amplitude of the control signal can be changed, etc.

The controller 204 is electrically connected to the positive electrode of the automobile power supply, the negative electrode of the automobile power supply, the bias circuit 201, the second switch circuit 202 and the buck chopper circuit 203, respectively, wherein the controller 204 does not operate when it is detected that the OBD connector 111 outputs a power supply positive electrode signal and it is not detected that the OBD connector 111 outputs a power supply negative electrode signal; the controller 204 detects a current detection signal flowing through the second switch circuit 202 when it is detected that the OBD connector 111 outputs the power supply positive electrode signal and it is detected that the OBD connector 111 outputs the power supply negative electrode signal, and outputs a pulse width modulated signal according to the bias voltage and the current detection signal to control the operating state of the second switch circuit 202, so that the buck chopper circuit 203 outputs the control signal.

It will be appreciated that the controller 204 calculates the internal voltage drop across the PMOS tube Q1 from the current detection signal, and the controller 204 outputs a pulse width modulated signal based on the bias voltage and the internal voltage drop across the PMOS tube Q1.

In the present embodiment, the controller 204 includes a single chip microcomputer, which may take the 51 series, the Arduino series, the STM32 series, etc.

The single chip microcomputer includes an input pin, an adjustable voltage pin, a current detection pin, an output pin, a power supply grounding pin, a controller grounding pin and a feedback pin. The input pin is electrically connected to the positive electrode of the automobile power supply for receiving the power supply voltage; the adjustable voltage pin is electrically connected to the bias circuit 201 for receiving the bias voltage; the current detection pin is electrically connected to the second switch circuit 202 and the buck chopper circuit 203 for acquiring the current detection signal; the output pin is electrically connected to the second switch circuit 202 for outputting the pulse width modulated signal; the power source grounding pin is connected to the negative electrode of the automobile power source; the controller grounding pin is connected to the negative electrode of the automobile power supply; the feedback pin is electrically connected to the voltage sampling circuit 205 for receiving the voltage sampling signal sent by the voltage sampling circuit 205.

In some embodiments, the controller 204 may also be a general purpose processor, a digital signal processor (DSP), an application specific integrated circuit (ASIC), a field programmable gate array (FPGA), a ARM (Acorn RISC Machine) or other programmable logic device, discrete gate or transistor logic, discrete hardware components, or any combination of these components. It can also be any conventional processor, controller, microcontroller or state machine; and it may also be implemented as a combination of computing devices, e. g. a combination of a DSP and a microprocessor, a plurality of microprocessors, one or more microprocessors in conjunction with a DSP core, or any other such configuration.

The voltage sampling circuit 205 is electrically connected to the negative electrode of the automobile power supply, the buck chopper circuit 203, the first switch circuit 10 and the controller 204, respectively, for sampling the control signal, so that the controller 204 feeds back and adjusts the control signal.

As shown in FIG. 6, the voltage sampling circuit 205 has a second resistor R2 and a third resistor R3.

Herein, one end of the second resistor R2 is connected to the buck chopper circuit 203 and the first switch circuit 10, and the other end of the second resistor R2 is connected to one end of the third resistor R3 and the controlleR204; and the other end of the third resistor R3 is connected to the negative electrode of the automobile power supply.

Specifically, the second resistor R2 and the third resistor R3 constitute a voltage dividing circuit, perform voltage dividing processing on the control signal, output a voltage sampling signal, and send the voltage sampling signal to the controller 204, so that the controller 204 feeds back and adjusts the control signal according to the voltage sampling signal.

The input filter circuit 206 is electrically connected between the positive electrode of the automobile power supply and the negative electrode of the automobile power supply for filtering the power supply voltage.

Herein, the input filter circuit 206 includes a third capacitor C3, one end of the third capacitor C3 is connected to the positive electrode of the automobile power supply, and the other end of the third capacitor C3 is connected to the negative electrode of the automobile power supply. The third capacitor C3 is specifically used for filtering out spike pulse and ripple voltages input by the automobile power supply 112, so as to smooth the signal waveform of the power supply voltage input to the bias circuit 201 and the second switch circuit 202.

In some embodiments, the input filter circuit 206 consists of reactive elements, such as capacitors in parallel across the load, or inductors in series with the load, as well as a composite filter constituted by capacitors and inductors.

It will be appreciated that the voltage sampling circuit 205 and/or the input filter circuit 206 may be omitted.

In some embodiments, referring to FIG. 4, the isolation circuit 100 further includes a slow start circuit 40, which is electrically connected to the first switch circuit 10 and the diagnostic device 200, respectively, and is used for delay processing the power supply voltage output by the automobile power supply 112 when the operating state of the first switch circuit 10 is switched to an on state.

It can be understood that a high-voltage spike pulse is generated at the moment when the first switch circuit 10 is turned on. If the power supply voltage output from the automobile power supply 112 directly acts on the diagnostic device 200 through the first switch circuit 10, the high-voltage spike pulse is also input to the diagnostic device 200, and may burn or break down internal components of the diagnostic device 200. By using the slow start circuit 40 to delay the power supply voltage output by the automobile power supply 112, it avoids the high-voltage spike pulse reaching the diagnostic device 200, and improving the safety of the isolation circuit 100.

An embodiment of the present invention provides an isolation circuit. A first switch circuit electrically connected between an OBD connector of an automobile to be diagnosed and a diagnostic device of the automobile diagnosis device. The OBD connector is further electrically connected to an automobile power supply of the automobile to be diagnosed; and a switch control circuit is electrically connected to the OBD connector and the first switch circuit respectively, wherein the switch control circuit does not operate when it is detected that the OBD connector outputs a power supply positive electrode signal and it is not detected that the OBD connector outputs a power supply negative electrode signal, so that the first switch circuit operates in an off state to ensure that the diagnostic device is not powered on; and the switch control circuit outputs a control signal when it is detected that the OBD connector outputs a power supply positive electrode signal and that the OBD connector outputs a power supply negative electrode signal, so that the first switch circuit operates in an on state so as to enable the automobile power supply to supply power to the diagnostic device. Therefore, the embodiment of the present invention can avoid poor grounding and improve the reliability of automobile diagnosis device.

Finally, it should be noted that the above embodiments are merely illustrative of the technical solutions of the present invention, rather than limiting it. Combinations of features in the above embodiments or in different embodiments are also possible within the spirit of the invention. The steps can be implemented in any order, and there are many other variations of the different aspects of the invention described above, which are not provided in detail for the sake of brevity. Although the invention has been described in detail with reference to the foregoing embodiments, those skilled in the art will appreciate that the technical solutions of the each above-mentioned embodiment can still be modified, or some of the technical features thereof can be equivalently substituted; and such modifications and substitutions will not cause the essence of the corresponding technical solutions to depart from the scope of the embodiments of the invention.

The invention claimed is:

1. An isolation circuit applied to an automobile diagnosis device, wherein the isolation circuit comprises:
 a switch circuit electrically connected between an Onboard diagnostics (OBD) connector of an automobile to be diagnosed and a diagnostic device of the automobile diagnosis device, wherein the OBD connector is also electrically connected to an automobile power supply of the automobile to be diagnosed;
 a switch control circuit electrically connected to the OBD connector and the switch circuit respectively, wherein it is detected the output signal from the OBD connector, when it is detected that the OBD connector outputs a power supply positive electrode signal and it is not detected that the OBD connector outputs a power supply negative electrode signal, the switch control circuit does not operate, so that the first switch circuit operates in an off state to ensure that the diagnostic device is not powered on; and when it is detected that the OBD connector outputs the power supply positive electrode signal and that the OBD connector outputs the power supply negative electrode signal, the switch control circuit outputs a control signal so that the switch circuit operates in an on state so as to enable the automobile power supply to supply power to the diagnostic device;
 wherein the automobile power supply comprises a positive electrode of the automobile power supply for outputting the power supply positive electrode signal and a negative electrode of the automobile power supply for outputting the power supply negative electrode signal, wherein the switch control circuit comprises:
 a bias circuit electrically connected to the positive electrode of the automobile power supply for converting a power supply voltage output by the positive electrode of the automobile power supply into a bias voltage;
 a second switch circuit electrically connected to the positive electrode of the automobile power supply;
 a buck chopper circuit electrically connected to the second switch circuit, the negative electrode of the automobile power supply and the switch circuit, respectively;
 a controller electrically connected to the positive electrode of the automobile power supply, the negative electrode of the automobile power supply, the bias circuit, the second switch circuit and the buck chopper circuit respectively, wherein the controller does not operate when it is detected that the OBD connector outputs a power supply positive electrode signal and it is not detected that the OBD connector outputs a power supply negative electrode signal; the controller detects a current detection signal flowing through the second switch circuit when it is detected that the OBD connector outputs the power supply positive electrode signal and it is detected that the OBD connector outputs the power supply negative electrode signal, and outputs a pulse width modulated signal according to the bias voltage and the current detection signal to control an operating state of the second switch circuit, so that the buck chopper circuit outputs the control signal.

2. The isolation circuit according to claim 1, wherein the bias circuit comprises a first resistor and a first capacitor; one end of the first resistor is connected to the positive electrode of the automobile power supply, one end of the first capacitor, and the second switch circuit; and the other end of the first resistor is connected to the other end of the first capacitor, and the controller.

3. The isolation circuit according to claim 1, wherein the second switch circuit comprises a PMOS tube, wherein a gate electrode of the PMOS tube is connected to the controller; a source electrode of the PMOS tube is connected to the positive electrode of the automobile power supply; and a drain electrode of the PMOS tube is connected to the controller and the buck chopper circuit.

4. The isolation circuit according to claim 3, wherein the buck chopper circuit comprises:
a freewheeling circuit electrically connected to the second switch circuit and the negative electrode of the automobile power supply, wherein freewheeling circuit operates in an off state when the second switch circuit operates in an on state, and operates in an on state when the second switch circuit operates in an off state;
a charge-discharge circuit electrically connected to the second switch circuit, the freewheeling circuit, the negative electrode of the automobile power supply, and the switch circuit, respectively, wherein the charge-discharge circuit performs charging as the freewheeling circuit operates in the off state when it is detected that the OBD connector outputs a power supply positive electrode signal and that the OBD connector outputs a power supply negative electrode signal; and the charge-discharge circuit performs discharging when the freewheeling circuit operates in an on state to output the control signal and send the control signal to the switch circuit.

5. The isolation circuit according to claim 4, wherein the freewheeling circuit comprises a diode, wherein the anode of the diode is connected to the negative electrode of the automobile power supply, and the cathode of the diode is connected to the drain electrode of the PMOS tube and the charge-discharge circuit.

6. The isolation circuit according to claim 5, wherein the charge-discharge circuit comprises an inductor and a second capacitor;
one end of the inductor is connected to the cathode of the diode and the drain electrode of the PMOS tube, and the other end of the inductor is connected to one end of the second capacitor and the first switch circuit; and the other end of the second capacitor is connected to the negative electrode of the automobile power supply.

7. The isolation circuit according to claim 1, wherein the switch control circuit further comprises a voltage sampling circuit electrically connected to the negative electrode of the automobile power supply, the buck chopper circuit, the switch circuit, and the controller, respectively, for sampling the control signal to cause the controller to feed back and adjust the control signal.

8. The isolation circuit according to claim 7, wherein the voltage sampling circuit comprises a second resistor and a third resistor;
one end of the second resistor is connected to the buck chopper circuit and the switch circuit, and the other end of the second resistor is connected to one end of the third resistor and the controller; and the other end of the third resistor is connected to the negative electrode of the automobile power supply.

9. The isolation circuit according to claim 7, wherein the switch control circuit further comprises an input filter circuit electrically connected between the positive electrode of the automobile power supply and the negative electrode of the automobile power supply for filtering the power supply voltage.

10. The isolation circuit according to claim 9, wherein the input filter circuit comprises a third capacitor, one end of the third capacitor is connected to the positive electrode of the automobile power supply and the other end of the third capacitor is connected to the negative electrode of the automobile power supply.

11. The isolation circuit according to claim 1, wherein the isolation circuit further comprises a slow start circuit which is electrically connected to the switch circuit and the diagnostic device, respectively, for delay processing the power supply voltage output by the automobile power supply when the operating state of the switch circuit is switched to the on state.

12. The isolation circuit according to claim 1, wherein the switch circuit comprises:
a first switch electrically connected between the positive electrode of the automobile power supply and the diagnostic device and also electrically connected to the switch control circuit, for operating in an on state according to the control signal;
a second switch electrically connected between the negative electrode of the automobile power supply and the diagnostic device and also electrically connected to the switch control circuit for operating in an on state according to the control signal.

13. The automobile diagnosis device, comprising:
the isolation circuit of claim 1;
the diagnostic device electrically connected to the isolation circuit and also communicatively connected to the automobile to be diagnosed for performing operation according to a power supply voltage provided by the automobile power supply of the automobile to be diagnosed when the isolation circuit operates in an on state, and acquiring diagnostic data of the automobile to be diagnosed.

14. An automobile diagnosis system, comprising:
the automobile diagnosis device of claim 13;
an upper computer communicatively connected to the automobile diagnosis device for displaying diagnostic data sent by the automobile diagnosis device.

* * * * *